LIGHT EMITTING DIODE

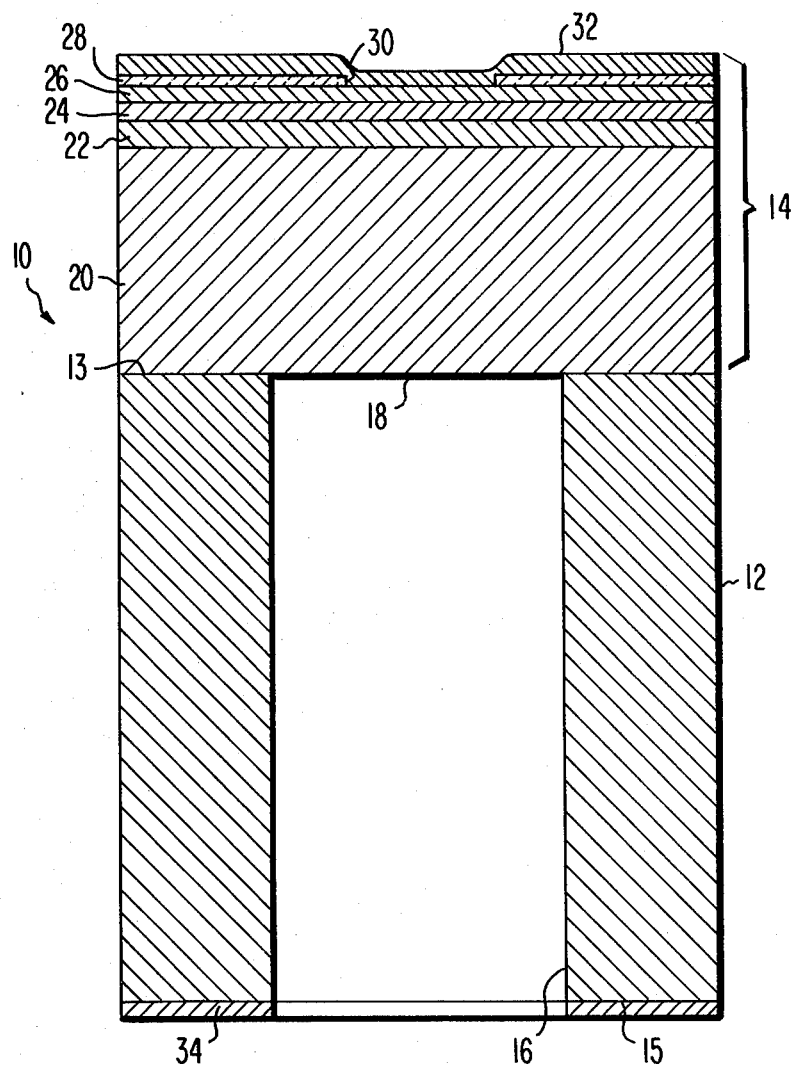

BACKGROUND OF THE INVENTION

The present invention relates to a light emitting diode, and particularly to a surface emitting light emitting diode having good rigidity.

In the development of light emitting diodes (LEDs) for optical fiber communications, two basic types of diodes have emerged: edge emitting LEDs and surface emitting LEDs. An edge emitting LED in general includes a body of a semiconductor material, generally of a Group III-V compound or alloy thereof, having a recombination region therein in which the light is generated and which extends to an edge of the body. There is also included a waveguide which helps direct the light generated in the body to the edge of the body where the light can be coupled to an optical fiber.

A surface emitting LED in general includes a body of a semiconductor material having a recombination region therein close to a surface of the body, wherein the material of the body between the recombination region and the emitting surface is substantially transparent to the light. This transparent region is generally referred to as the "window". Thus, the light generated in the recombination region can pass through the window to the surface where it is coupled into an optical fiber.

One type of surface emitting LED has the body of the semiconductor material formed on a substrate which has an opening therethrough to the emitting surface of the body. Such an LED is shown in U.S. Pats. Nos. 4,053,914 by Anthony Richard Goodwin entitled "LIGHT EMISSIVE DIODE", issued Oct. 11, 1977; 4,010,483 by Yet-Zen Liu entitled "CURRENT CONFINING LIGHT EMITTING DIODE" issued Mar. 1, 1977; and 3,936,855 by James Emanuel Goell et al entitled "LIGHT EMITTING DIODE FABRICATION PROCESS" issued Feb. 3, 1976. However, as pointed out in an article by J. C. Dyment et al entitled "PROTON BOMBARDMENT DOUBLE HETEROSTRUCTURE LEDS", published in *Journal Electronic Materials*, Vol. 6, No. 2, 1977, pp. 173-193, a problem with this type of LED is a high tendency for initial failure, i.e., failure after a very short period of operation.

SUMMARY OF THE INVENTION

A light emitting diode including a substrate, and a body of semiconductor material on the substrate. The body includes a window of a material which is transparent to the generated light and is of a thickness of between 15 microns and 30 microns and means capable of generating light. The substrate has an opening therethrough to the window.

BRIEF DESCRIPTION OF THE DRAWING

The FIGURE of the drawing is a cross-sectional view of one form of a light emitting diode incorporating the present invention.

DETAILED DESCRIPTION

Applicants have discovered what they believe to be the reason for the high tendency for initial failure in the type of surface emitting LEDs shown in U.S. Pat. Nos. 4,053,914, 4,010,483 and 3,936,855. They believe that it results from defects in the body of the LED. The windows of these devices are relatively thin, not greater than 10 microns and generally not greater than 2 microns in thickness, and the substrates are also relatively thin. The thin window is used to insure the transmission of the generated light therethrough. However, these thin dimensions make the LEDs more susceptible to damage during handling, resulting in the high tendency for initial failure. To overcome this problem, applicants have developed an LED which is strong, and therefore not as easily damaged, yet still provides good transmission of light from the recombination region to the emitting surface.

Referring to the drawing, one form of a light emitting diode (LED) which includes the present invention is generally designated as 10. The LED 10 includes a substrate 12 and a body 14 of a single crystal semiconductor material, preferably a Group III-V compound or alloy thereof, on a surface of the substrate 12. The substrate 12 is made of a material which will propagate the epitaxial growth of the material of the body 14. Thus, for a body 14 of a Group III-V compound or alloy thereof, the substrate 12 is preferably of a Group III-V compound, such as gallium arsenide. The substrate 12 is of a conductivity type which is the same as that of the adjacent portion of the body 14 and contains sufficient conductivity modifier to be highly conductive. Thus, if the adjacent portion of the body 14 is of N type conductivity, the substrate 12 is of N+ type conductivity. The substrate 12 has an opening 16 therethrough to the surface 18 of the body 14 and may have a thickness of up to about 70 microns.

The body 14 includes a window layer 20 on the surface 13 of the substrate 12. The window layer 20 is of N type $Al_xGa_{1-x}As$, where x varies from about 0.4 at the substrate surface to about 0.2 at its other surface, has a thickness of between about 15 and 30 microns, preferably between 20 and 25 microns.

On the window layer 20 is a layer 22 of P type $Al_yGa_{1-y}As$, where y is between 0.05 and 0.08. The layer 22 has a thickness of about 2 to 2.5 microns and is the recombination region of the LED. On the recombination region layer 22 is a thin layer 24 of P type $Al_zGa_{1-z}As$, where z is about 0.2 to 0.25. The layer 24 has a thickness of about 1 to 1.5 microns. On the layer 24 is a contact layer 26 of P+ type gallium arsenide having a thickness of about 0.3 to 0.5 micron. On the contact layer 26 is a thin insulating layer 28, preferably of a silicon dioxide. This insulating layer 28 has an opening 30 therethrough to the surface of the contact layer 26. A metal contact film 32 is on the insulating layer 28 and extends into and across the opening 30 to make contact with the contact layer 26. A second metal contact film 34 is on the exposed surface 15 of the substrate 12. The contact film 32 on the P+ contact layer 26 may be made of any metal which adheres well to and has good ohmic contact with the semiconductor material. For example, a trilayer of first titanium, then platinum, then finally gold, has been found to be satisfactory for the contact film. The contact film 34 to the N substrate 12 may be of tin, covered with nickle and then gold.

The LED 10 is made by depositing the various layers of the body 14 on the substrate 12 using the well known technique of liquid phase epitaxy. This may be achieved using the apparatus and method described in U.S. Pat. No. 3,753,801 to H. F. Lockwood et al, entitled "METHOD OF DEPOSITING EPITAXIAL SEMICONDUCTOR LAYERS FROM THE LIQUID PHASE", issued Aug. 21, 1973. The apparatus includes a furnace boat having a plurality of wells in the top portion of the recombination layer 22 which is aligned with opening 16 in the substrate 12. The light passes through the window layer 20, which is transparent to the light, to the surface 18. An optical fiber can be inserted into the opening 16 on the substrate 12 to couple the light into the optical fiber.

The LED 10 has a thick window layer 20 so that the LED is more sturdy. Therefore, the LED 10 is less susceptible to being damaged during handling which results in A LED which is more reliable, particularly with regard to initial failure. Although the window layer 20 is considerably thicker than the window layer of the prior art LEDs, we have found that contrary to what would be expected, the external efficiency, i.e., the amount of light transmitted through the window, is not affected since there is only negligible absorption of light in the window layers even though the window layer is thicker. In addition we have found that the thicker window layer can be easily deposited on the substrate in a single step by liquid phase epitaxy so that the thicker window layer does not substantially increase the cost of making the LED. We have found that a window layer of a thickness between 15 and 30 microns provides the desired rigidity without adversely affecting the external efficiency of the LED or the manner of making the LED. A window layer of a thickness less than 15 microns will be too thin to provide the desired rigidity and above 30 microns will be too difficult to deposit in a single step process.

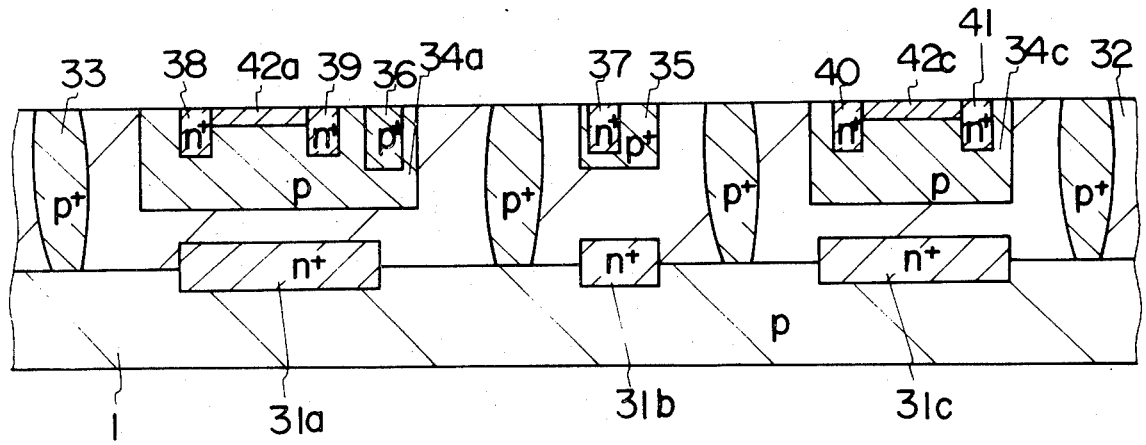

We claim:

1. A light emitting semiconductor device comprising a body of semiconductor material on a substrate of a semiconductor material, said body including a window layer adjacent to said substrate, and layers of opposite conductivity type on said window layer with the layer adjacent said window layer being a recombination region in which light can be generated, said window layer being of a material which is transparent to said generated light and having a thickness of between 15 and 30 microns, and said substrate having an opening therethrough to said window layer.

2. A light emitting semiconductor device in accordance with claim 1 wherein the body is of a Group III-V compound or alloy thereof.

3. A light emitting semiconductor device in accordance with claim 2 wherein the window layer is of $Al_xGa_{1-x}As$ where x is about 0.4 at the substrate and decreases across the thickness of the window layer to about 0.2.

4. A light emitting semiconductor device in accordance with claim 3 wherein the substrate is of a material which will propagate the epitaxial growth thereon of the semiconductor material of the window layer.

5. A light emitting semiconductor device in accordance with claim 4 in which the substrate is gallium arsenide.

6. A light emitting semiconductor device in accordance with claim 5 wherein the substrate and the window layers are of the same conductivity type.

* * * * *

United States Patent [19]

Takemoto et al.

[11] 4,233,615
[45] Nov. 11, 1980

[54] SEMICONDUCTOR INTEGRATED CIRCUIT DEVICE

[75] Inventors: Toyoki Takemoto, Yahata; Tadao Komeda, Yamatotakada; Haruyasu Yamada; Michihiro Inoue, both of Hirakata, all of Japan

[73] Assignee: Matsushita Electric Industrial Co., Ltd., Kadoma, Japan

[21] Appl. No.: 933,045

[22] Filed: Aug. 10, 1978

[30] Foreign Application Priority Data

Aug. 25, 1977 [JP] Japan ................... 52-102427

[51] Int. Cl.$^2$ .................... H01L 29/80; H01L 29/78
[52] U.S. Cl. ........................... 357/22; 357/23; 357/41; 357/48; 357/51; 357/52; 357/43
[58] Field of Search .................. 357/43, 51, 22, 41, 357/23, 48, 52

[56] References Cited

U.S. PATENT DOCUMENTS

| 3,725,136 | 4/1973 | Morgan | 148/1.5 |
| 4,032,962 | 6/1977 | Balyoz | 357/68 |
| 4,095,252 | 6/1978 | Ochi | 357/43 |

*Primary Examiner*—Martin H. Edlow
*Attorney, Agent, or Firm*—Cushman, Darby & Cushman

[57] ABSTRACT

An IC device comprising a junction type field effect transistor of a back gate type and a bipolar device such as a bipolar transistor and a resistor made of impurity diffused region, wherein an extremely thin (in the order of 0.05-0.2 μm) impurity doped surface region of a conductivity type same as that of a back gate region is formed at the surface of a surface channel region, and is separated from at least a drain region to sustain high breakdown voltage between gate region and the drain region; the impurity surface region serving to reduce noise and also enabling to achieve satisfactory characteristics of J-FET and also good ohmic characteristics of the resistor.

25 Claims, 15 Drawing Figures